United States Patent [19]

Noguchi et al.

[11] Patent Number: 5,155,051
[45] Date of Patent: Oct. 13, 1992

[54] METHOD OF MANUFACTURING PHOTOVOLTAIC DEVICE

[75] Inventors: Shigeru Noguchi, Hirakata; Hiroshi Iwata, Neyagawa; Keiichi Sano, Takatsuki, all of Japan

[73] Assignee: Sanyo Electric Co., Ltd., Moriguchi, Japan

[21] Appl. No.: 717,927

[22] Filed: Jun. 20, 1991

[30] Foreign Application Priority Data

Jun. 22, 1990 [JP] Japan ................................. 2-165123
Oct. 15, 1990 [JP] Japan ................................. 2-276643
Oct. 15, 1990 [JP] Japan ................................. 2-277307

[51] Int. Cl.⁵ ......................................... H01L 31/0368
[52] U.S. Cl. .......................................... 437/4; 437/109; 437/233; 437/967; 136/258
[58] Field of Search .............. 136/258; 357/30; 437/4, 437/101, 109, 233, 967; 148/DIG. 120

[56] References Cited

U.S. PATENT DOCUMENTS 4,062,038 12/1977 Cuomo et al. ................. 136/258 PC
4,431,858  2/1984 Gonzalez et al. ............. 136/258 PC

FOREIGN PATENT DOCUMENTS 334110  9/1989 European Pat. Off. ................. 437/4
 3441044  5/1986 Fed. Rep. of Germany ...... 136/258 AM
 2030766  4/1980 Japan ............................ 136/258 AM
63-152177  6/1988 Japan ................................. 437/4
63-170976  7/1988 Japan ................................. 437/4
 2185072  7/1990 Japan ................................. 437/4

OTHER PUBLICATIONS

Sarma, K., "Polycrystalline Silicon Solar Cells from Recrystallized Plasma Deposited Thin Films", *Journal of Electronic Materials*, vol. 9, No. 5, 1980, pp. 841-856.
Brodsky, M., "Making Higher Efficiency Solo Cells with Polycrystalline Si Films", IBM Tech. Disc. Bull. vol. 18, No. 2, Jul. 1975, pp. 582-583.
Fisher, Ite, "Low Cost... Silicon", *IEEE Transactions on Electron Devices*, vol. ED-24, No. 4, Apr., 1977, pp. 438-442.
Wallace, J., "Crystallized Amorphous Silicon for Low Cost Solar Cells", *Solar Cells*, 30 (1991) pp. 403-413.
Charles, H., "Review of Amorphous... Parameters", *Solar Energy*, vol. 24, 1980, pp. 329-339.
Optimum Design of a-Si/poly c-Si Stacked Solar Cell, pp. 394-397 Technical Digest of 2nd Int. Photovoltaic Science & Engineering Conference, 1986.

*Primary Examiner*—Oiik Chaudhuri
*Assistant Examiner*—G. Fourson
*Attorney, Agent, or Firm*—W. G. Fasse

[57] ABSTRACT

A method of manufacturing a photovoltaic device, wherein an amorphous semiconductor layer of one conductivity type doped with impurities which determine the conductivity type is formed on a substrate having a conductive surface, an insulating film is formed on this amorphous semiconductor layer, the insulating film is patterned to partially form aperture regions where the surface of said amorphous semiconductor layer is exposed, an intrinsic amorphous semiconductor layer on said insulating film and the aperture regions formed over the substrate, the amorphous semiconductor layer of one conductivity type and the intrinsic amorphous semiconductor layer are thermally treated, crystallization is advanced using the amorphous semiconductor layer of one conductivity type located beneath said aperture region as a core to form a polycrystal semiconductor layer of one conductivity type, a semiconductor layer of the other conductivity type is formed on this polycrystal semiconductor layer, and an electrode is formed in contact with the semiconductor layer region of the other conductivity type located over said aperture regions.

13 Claims, 10 Drawing Sheets

METHOD OF MANUFACTURING PHOTOVOLTAIC DEVICE

BACKGROUND OF THE INVENTION

1. Field of the Invention

The invention relates to a manufacturing method of a photovoltaic device used as a solar cell, a photosensor and so on.

2. Description of the Background Art

Generally, a photovoltaic device has a structure in which a transparent electrode, semiconductor layers having p, i, and n conductivity types, and a back electrode are layered on a light-transmissible substrate such as glass plate or the like in this order.

In such a photovoltaic device, in order to enhance a photoelectric converting efficiency, there has been proposed a semiconductor layered structure obtained by layering an amorphous semiconductor layer and a crystalline semiconductor layer, structured by a laminate of p-type polycrystalline silicon and n-type amorphous silicon as disclosed in Technical Digest of 2nd International Photovoltaic Science and Engineering Conference 1986, pp. 394–397.

Although a polycrystalline silicon layer is formed by a CVD method or a combination of the CVD method and recrystallization, these methods result in that the grain size of the polycrystalline silicon becomes smaller and so many grain boundaries are included. In the grain boundaries, recombination and so on of photo-generated carriers tend to occur, causing an obstacle to improvement of the photoelectric converting efficiency.

SUMMARY OF THE INVENTION

In view of the prior art, an object of the present invention is to provide a method of manufacturing a photovoltaic device having a polycrystalline semiconductor layer with a large grain size and small grain boundary.

In accordance with a first aspect of the present invention, a method comprises the steps of: forming an amorphous semiconductor layer of one conductivity type doped with impurities which determine the conductivity type on a substrate having a conductive surface; forming an insulating film on this amorphous semiconductor layer; patterning this insulating film and partially forming aperture regions where the surface of said amorphous semiconductor layer is exposed; forming an intrinsic amorphous semiconductor layer on said insulating film and the aperture regions formed over the substrate; applying a thermal treatment to said amorphous semiconductor layer having one conductivity type and the intrinsic amorphous semiconductor layer, developing crystallization using the amorphous semiconductor layer of one conductivity type located under said aperture regions as a core, and forming a polycrystalline semiconductor layer of one conductivity type; forming a semiconductor layer of opposite conductivity type on this polycrystalline semiconductor layer; and forming an electrode which comes in contact with the semiconductor layer region of opposite conductivity type located over said aperture regions.

In accordance with a second aspect of the present invention, a method comprises the steps of: forming an insulating film on a substrate having a conductive surface; patterning this insulating film and partially forming aperture regions where the surface of said substrate is exposed; forming an amorphous semiconductor layer of one conductivity type doped with impurities which determine the conductivity type only in the aperture regions; forming an intrinsic amorphous semiconductor layer on said insulating film and the amorphous semiconductor layer of one conductivity type formed over said substrate; applying a thermal treatment to said amorphous semiconductor layer of one conductivity type and the intrinsic amorphous semiconductor layer, advancing crystallization using said amorphous semiconductor layer of one conductivity type as a core, and forming a polycrystalline semiconductor layer of one conductivity type; forming a semiconductor layer of opposite conductivity type on this polycrystalline semiconductor layer; and forming an electrode which comes in contact with the semiconductor layer region of opposite conductivity type located over said aperture regions.

In accordance with a third aspect of the present invention, a method comprises the steps of: forming a semiconductor layer of one conductivity type and an intrinsic amorphous semiconductor layer layered in this order on a substrate having a conductive surface; forming an insulating film on this amorphous semiconductor layer; patterning this insulating film and partially forming aperture regions where the surface of said intrinsic amorphous semiconductor layer is exposed; forming an amorphous semiconductor layer of opposite conductivity type on said insulating film and the aperture regions formed over the substrate; applying a thermal treatment to said intrinsic amorphous semiconductor layer and the amorphous semiconductor layer of opposite conductivity type, advancing crystallization using the amorphous semiconductor layer of opposite conductivity type located in said aperture regions as a core, and forming a polycrystalline semiconductor layer of opposite conductivity type; and forming an electrode which comes in contact with said polycrystalline semiconductor layer region of opposite conductivity type located over said aperture regions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment of the present invention will now be described with reference to FIGS. 1 and 2.

Figure 1A:
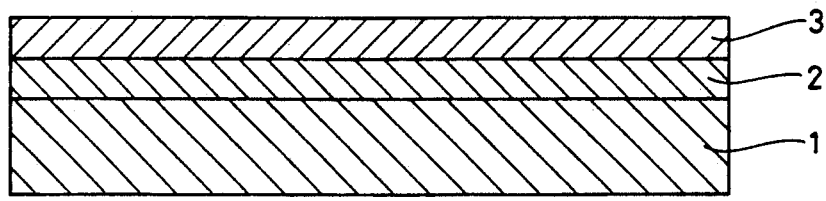
FIGS. 1A to G are sectional views showing a manufacturing method of a photovoltaic device according to a first embodiment of the present invention in order of process.

Firstly, as shown in FIG. 1A, an n+-type amorphous silicon layer 2 having a thickness of 5000 Å doped with n-type impurities is formed on a substrate 1 having a conductive surface, for example, obtained by coating the surface of a plate of glass, ceramics or the like with a metal layer or including a metal plate such as stainless. The n+-type amorphous silicon layer 2 is formed, for example, using a radio frequency (RF) glow discharge method. At this time, as reactive gases, $SiH_4$ with a flow rate of 10 sccm and $PH_3$ (1%)/$H_2$ with a flow rate of 10 sccm are employed and other forming conditions are the temperature of the substrate 1: 300° C., the RF power: 20 W, and the gas pressure: 300 mTorr.

Subsequently, an insulating film 3 having a thickness of 10–100 Å such as silicon oxide is formed on this amorphous silicon layer 2. For example, the insulating film 3 including silicon oxide is formed by sputtering. As reactive gases, argon (Ar) with a flow rate of 16 sccm and $O_2$ with a flow rate of 4 sccm are employed and other forming conditions are the RF power: 300 W, and the temperature of the substrate 1: 300° C.

Figure 1B:
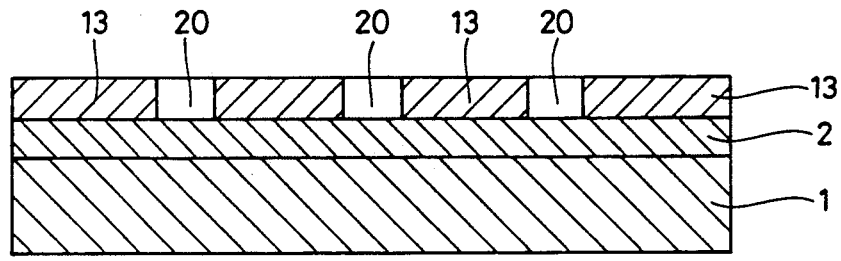
Figure 2:
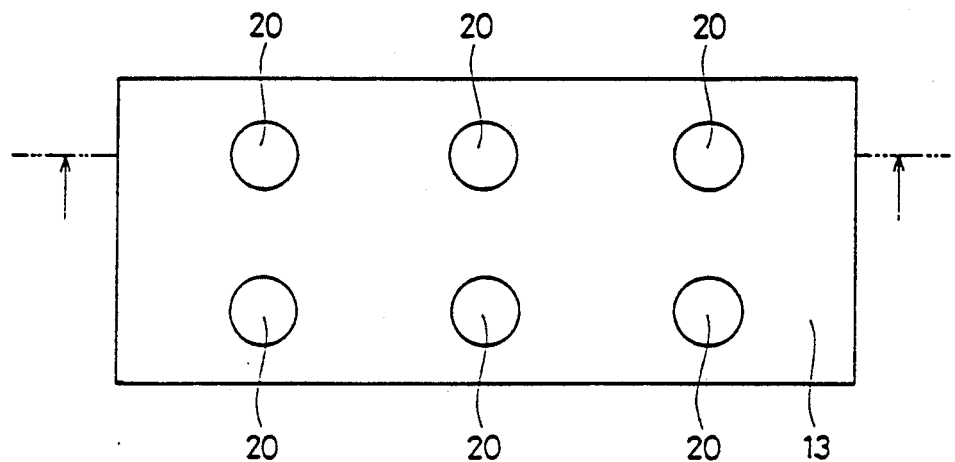
FIG. 2 is a view of the upper surface corresponding to FIG. 1B.

As shown in FIGS. 1B and 2, the insulating film 3 is patterned by photolithography to form land regions 13 of the remaining insulating film 3 and aperture regions 20 of almost circular shape where the surface of the n+-type amorphous silicon layer 2 is partially exposed, wherein the distance between the aperture regions 20 is set to be on the order of 1–500 μm.

Figure 1C:
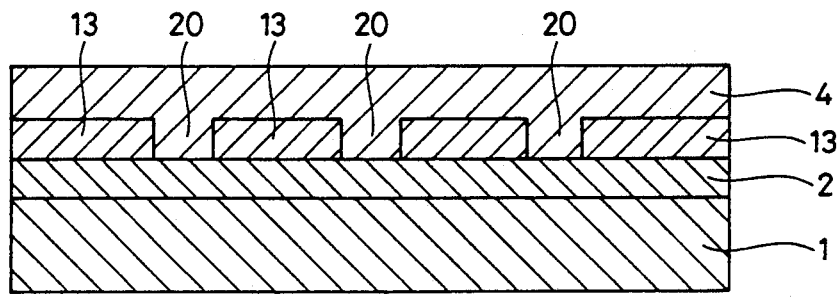

Then, as shown in FIG. 1C, an i-type amorphous silicon layer 4 having a thickness of 10 μm is formed on the land regions 13 and the aperture regions 20 formed over the substrate 1. The i-type amorphous silicon layer 4 is, for example, formed using the radio frequency (RF) glow discharge method. As a reactive gas, $SiH_4$ with a flow rate of 10 sccm is employed and other forming conditions are the temperature of the substrate 1: 550° C., the RF power: 20 W and the gas pressure: 300 mTorr. This i-type amorphous silicon layer 4 is in contact with the n+-type amorphous silicon layer 2 at portions in the aperture regions 20.

Figure 1D:
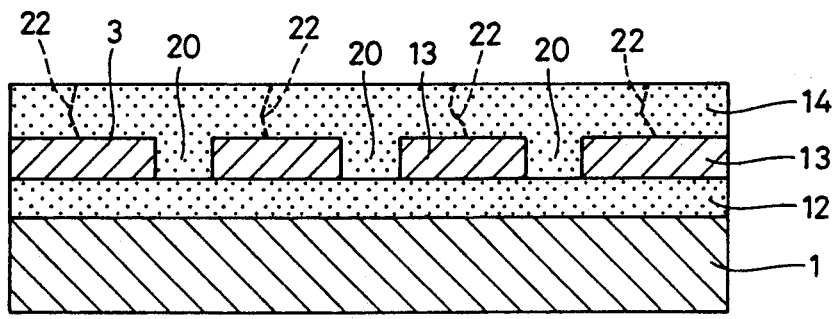

Furthermore, in the process shown in FIG. 1D, the composite including the substrate 1 is housed in a vacuum chamber, held at the temperature of 600° C. and thermally treated. As a result, the n+-type amorphous silicon layer 2 and the i-type amorphous semiconductor layer 4 are crystallized and an n+-type polycrystalline silicon layer 12 and an n−-type polycrystalline silicon layer 14 are formed. This process of crystallization is called "solid phase growth". When growing, the n+-type amorphous silicon layer 2 crystallizes earlier than the i-type amorphous silicon layer 4, the n+-type amorphous silicon layer 2 located in the aperture regions 20 becomes a core for crystallization of the i-type amorphous silicon layer 4, and the crystallization proceeds radially from the portions of the aperture regions 20. Therefore, grain boundary portions 22 concentrate in the intermediate portions of adjacent aperture regions 20, 20.

Figure 1E:
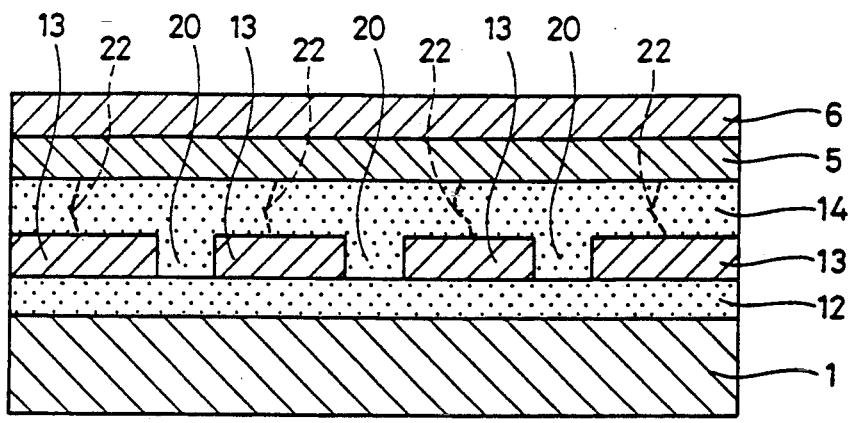

After that, as shown in FIG. 1E, a p+-type amorphous silicon layer 5 having a thickness of 500 Å is formed on the n−-type polycrystalline silicon layer 14 and then an insulating film 6 having a thickness of 5000 Å including silicon oxide and so on is formed on this p+-type amorphous silicon layer 5. The p+-type amorphous silicon layer 5 is formed using the radio frequency (RF) glow discharge method. As reactive gases, $SiH_4$ with a flow rate of 10 sccm and $B_2H_6$ (1%)/$H_2$ with a flow rate of 10 sccm are employed and other forming conditions are the temperature of the substrate 1: 300° C., the RF power: 20 W, and the gas pressure: 300 mTorr. If silicon oxide is formed as the insulating film 6, it is formed by sputtering. As reactive gases, argon (Ar) with a flow rate of 16 sccm and $O_2$ with a flow rate of 4 sccm are employed and other forming conditions are the RF power: 300 W and the temperature of the substrate 1: 300° C.

Figure 1F:
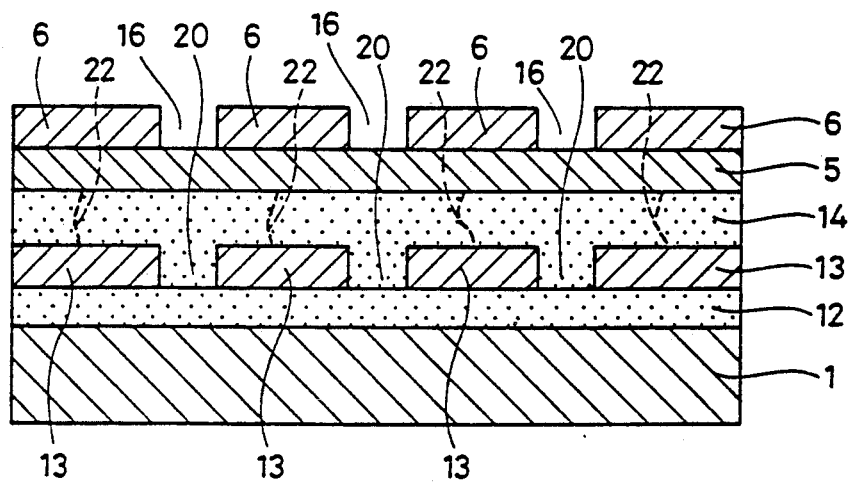

After that, as shown in FIG. 1F, the insulating film 6 is patterned by photolithography and contact holes 16 are formed in places above the aperture regions 20.

Figure 1G:
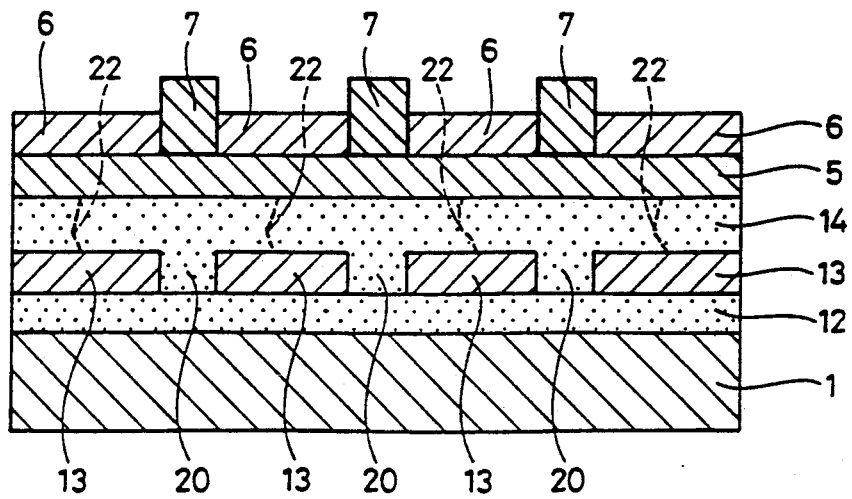

Finally, as shown in FIG. 1G, surface electrodes 7 of comb-shape are formed only in the vicinity of the contact holes 16. The surface electrodes 7 are obtained by forming a single layer film including a metal such as silver, titanium, aluminum, copper or a multilayer film including these metals on the surface of the insulating film 6 by evaporation or sputtering and patterning the same.

In the photovoltaic device manufactured in this way, when light is entered from the side of the surface electrodes 7, photocarriers are generated and the generated photocarriers are collected to the sides of the substrate 1 to be a back electrode and the surface electrodes 7. At this time, the surface electrodes 7 are in contact with the p+-type amorphous silicon layer 5 above the aperture regions 20 and the grain boundaries 22 are located in the intermediate portions of the aperture regions 20, 20, so that the probability that the photocarriers cross the grain boundaries 22 becomes very low, recombination of the photocarriers in the portions of the grain boundaries 22 is controlled by a large margin and the photoelectric converting efficiency is enhanced.

A second embodiment of the present invention will now be described with reference to FIGS. 3A to G.

Figure 3A:
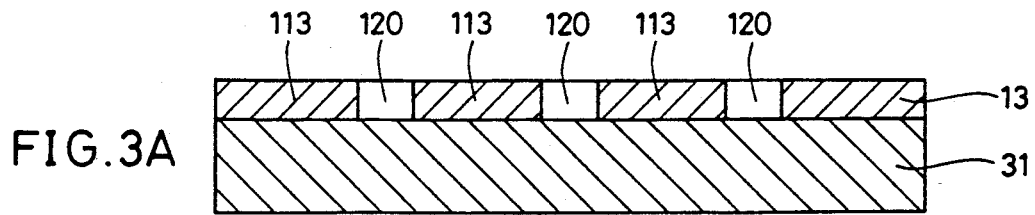
FIGS. 3A to G are sectional views showing a manufacturing method of a photovoltaic device according to a second embodiment of the present invention in order of process.

Firstly, as shown in FIG. 3A, an insulating film having a thickness of 10–100 Å such as silicon oxide is formed on a substrate 31 having a conductive surface, for example, obtained by coating the surface of a plate of glass, ceramics or the like with a metal layer or including stainless and so on. For example, the insulating film including silicon oxide is formed by sputtering. As reactive gases, argon (Ar) with a flow rate of 16 sccm and $O_2$ with a flow rate of 4 sccm are employed and other forming conditions are the RF power: 300 W, and the temperature of the substrate 31: 300° C.

Thereafter, the insulating film is patterned by photolithography to form land regions 113 of the remaining insulating film and aperture regions 120 of almost circular shape where the surface of the substrate 31 is partially exposed, wherein the distance between the two adjacent aperture regions 120 is set to be on the order of 1–500 μm.

Figure 3B:
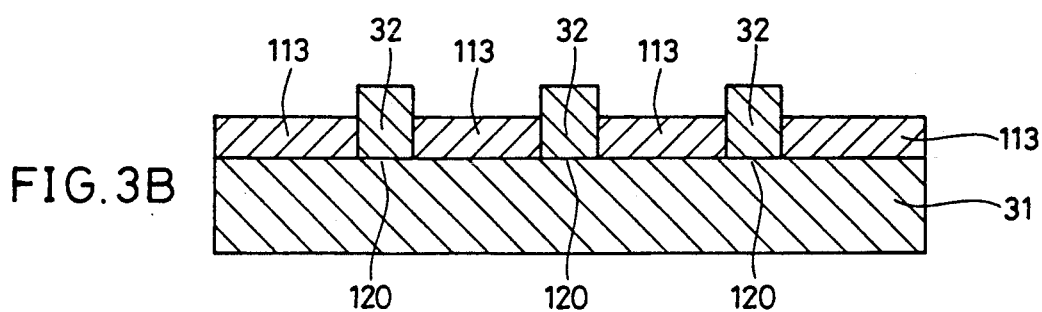

Subsequently, as shown in FIG. 3B, an n+-type amorphous silicon layer 32 having a thickness of 5000 Å doped with n-type impurities is formed on the land regions 113 and the aperture regions 120 formed over the substrate 31. For example, the n+-type amorphous silicon layer 32 is formed using the radio frequency (RF) glow discharge method. As reactive gases, SiH$_4$ with a flow rate of 10 sccm and PH$_3$ (1%)/H$_2$ with a flow rate of 10 sccm are employed and other forming conditions are the temperature of the substrate 31: 300° C., the RF power: 20 W and the gas pressure: 300 mTorr. Then, this amorphous silicon layer 32 is patterned to remain only in the aperture regions 120.

Figure 3C:
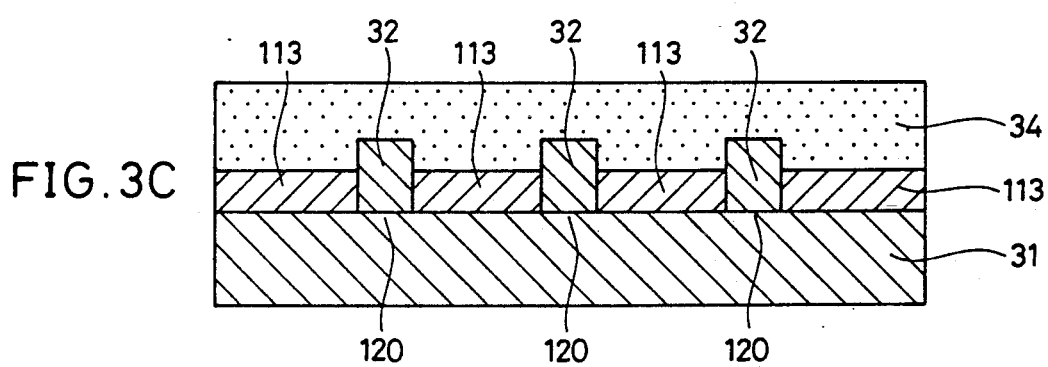

Then, as shown in FIG. 3C, an i-type amorphous silicon layer 34 having a thickness of 10 μm is formed on the n+-type amorphous silicon layer 32 and the land regions 113 formed over the substrate 31. This i-type amorphous silicon layer 34 is formed by the RF glow discharge method in the same way as the one stated above.

Figure 3D:
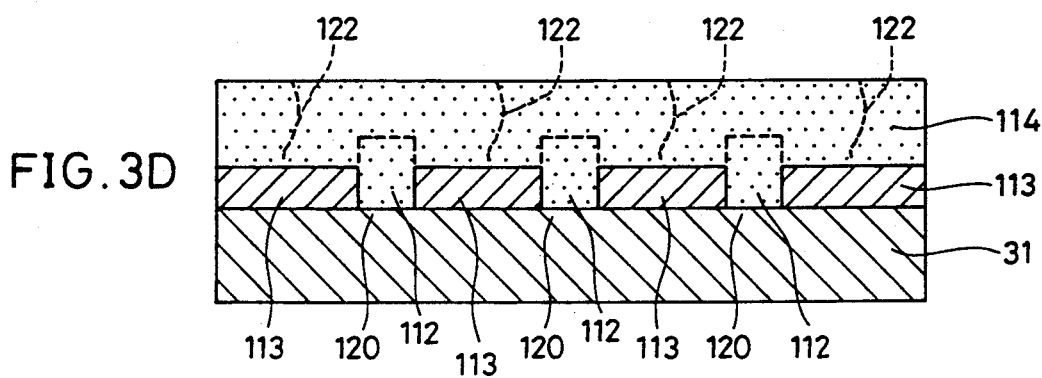

Furthermore, in the process shown in FIG. 3D, the composite including the substrate 31 is housed in a vacuum chamber, held at a temperature of 600° C. and thermally treated. As a result, the n+-type amorphous silicon layer 32 and the i-type amorphous semiconductor layer 34 are crystallized to form an n+-type polycrystalline silicon layer 112 and an n−-type polycrystalline silicon layer 114. When growing, the n+-type amorphous silicon layer 32 crystallizes earlier than the i-type amorphous silicon layer 34, the n+-type amorphous silicon layer 32 formed in the aperture regions 120 becomes a core of crystallization of the i-type amorphous silicon layer 34, and the crystallization proceeds radially from the portions of the aperture regions 120. Therefore, grain boundary portions 122 concentrate in the intermediate portions of the adjacent aperture regions 120, 120.

Figure 3E:
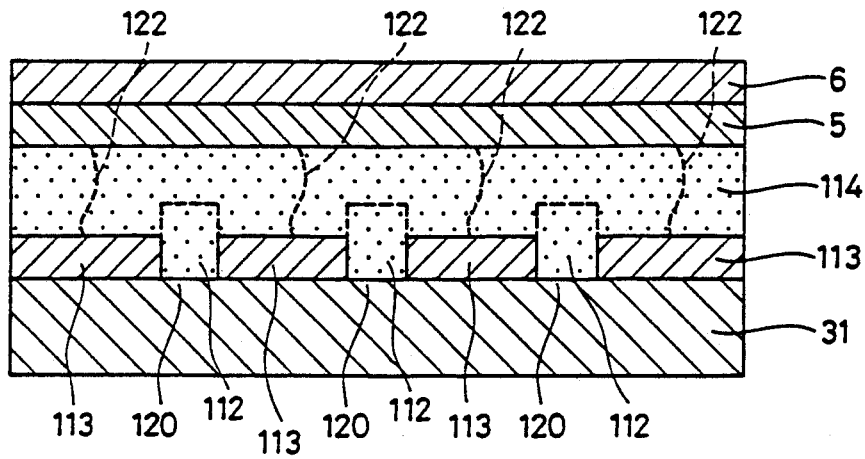
Figure 3F:
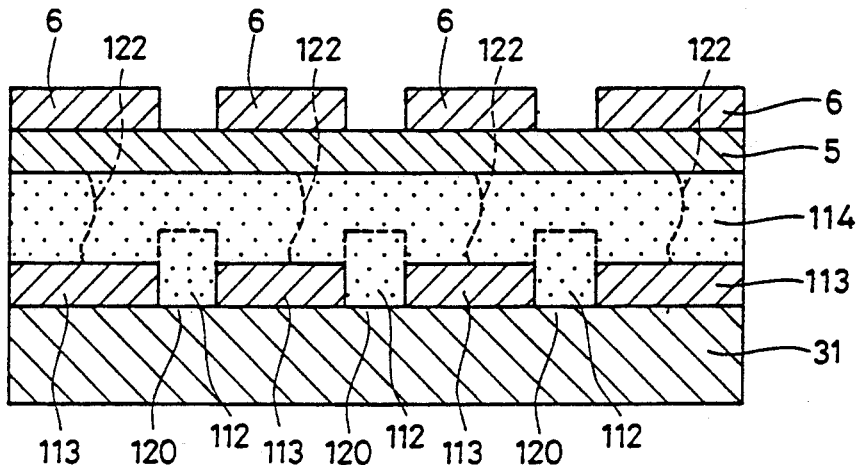
Figure 3G:
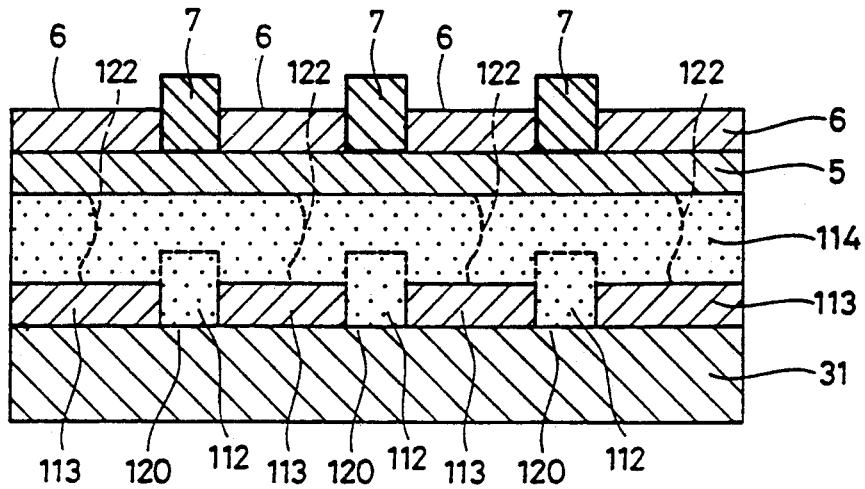

After that, according to the processes shown in FIGS. 3E to G, a photovoltaic device is formed. As the processes of FIGS. 3E to G are the same as those shown in FIGS. 1E to G stated above, respectively, the description thereof will not be repeated here.

A third embodiment of the present invention will now be described with reference to FIGS. 4 and 5.

Figure 4A:
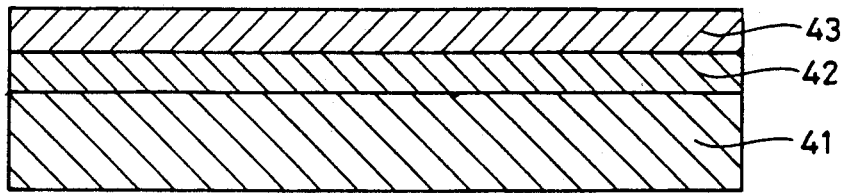
FIGS. 4A to G are sectional views showing a manufacturing method of a photovoltaic device according to a third embodiment of the present invention in order of process.

Firstly, as shown in FIG. 4A, an n+-type amorphous silicon layer 42 having a thickness of 5000 Å doped with n-type impurities is formed on a substrate 41 having a conductive surface, for example, obtained by coating the surface of glass, ceramics and so on with a metal layer, or including stainless and so on. For example, the n+-type amorphous silicon layer 42 is formed using the radio frequency (RF) glow discharge method. As reactive gases, SiH$_4$ with a flow rate of 10 sccm and PH$_3$ (1%)/H$_2$ with a flow rate of 10 sccm are employed and other forming conditions are the temperature of the substrate 41: 300° C., the RF power 20 W and the gas pressure: 300 mTorr.

Subsequently, an insulating film 43 having a thickness of 10-100 Å such as silicon oxide is formed on this amorphous silicon layer 42. For example, the insulating film 43 including silicon oxide is formed by sputtering. As reactive gases, argon (Ar) with a flow rate of 16 sccm and O$_2$ with a flow rate of 4 sccm are employed and other forming conditions are the RF power: 300 W and the temperature of the substrate 41: 300° C.

Figure 5:
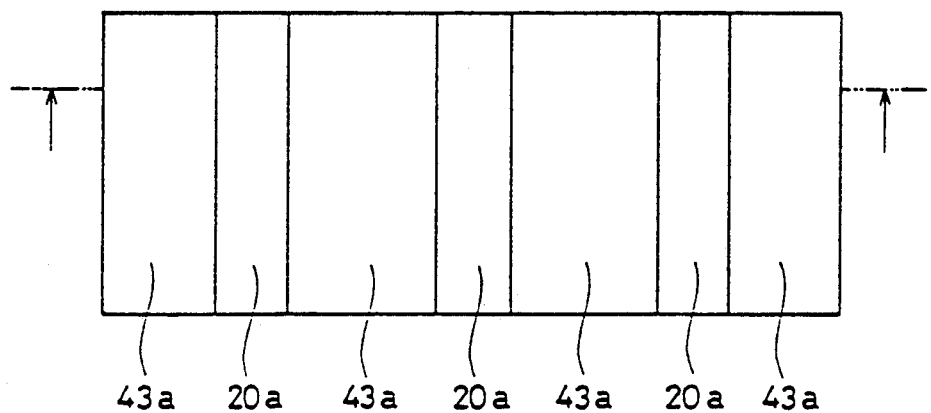
FIG. 5 is a view of the upper surface of FIG. 4B.
Figure 4B:
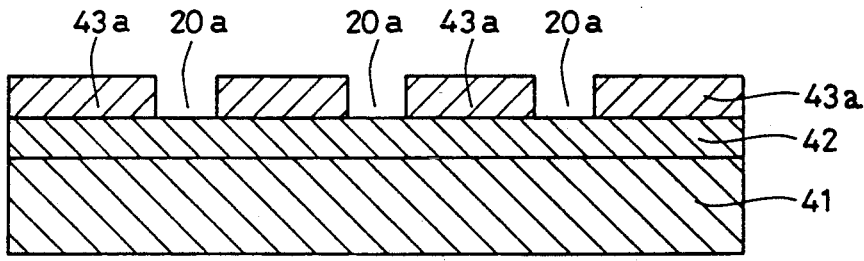

As shown in FIGS. 4B and 5, the insulating film 43 is patterned by photolithography to form island regions 43a of the remaining insulating film 43 and strait regions 20a where the surface of the n+-type amorphous silicon layer 2 is partially exposed, wherein the distance between the two adjacent strait regions 20a is set to be on the order of 1-500 μm.

Figure 4C:
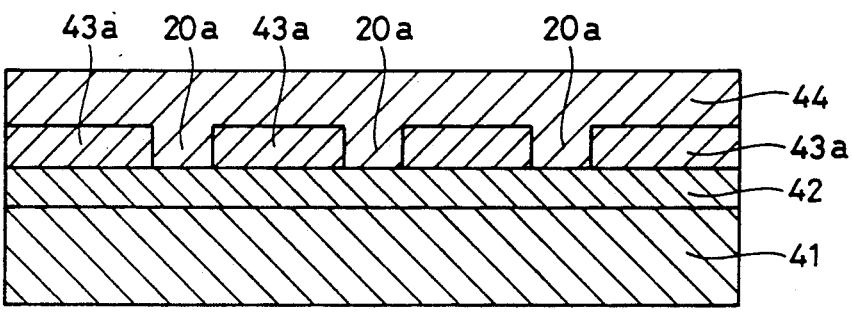

Then, as shown in FIG. 4C, an i-type amorphous silicon layer 44 having a thickness of 10 μm is formed on the island regions 43a and the strait regions 20a formed over the substrate 41. For example, the i-type amorphous silicon layer 44 is formed using the radio frequency (RF) glow discharge method. As a reactive gas, SiH$_4$ with a flow rate of 10 sccm is employed and other forming conditions are the temperature of the substrate 41: 550° C., the RF power: 20 W, and the gas pressure: 300 mTorr. This i-type amorphous silicon layer 44 is in contact with the n+-type amorphous silicon layer 42 in the portions of the strait regions 20a.

Figure 4D:
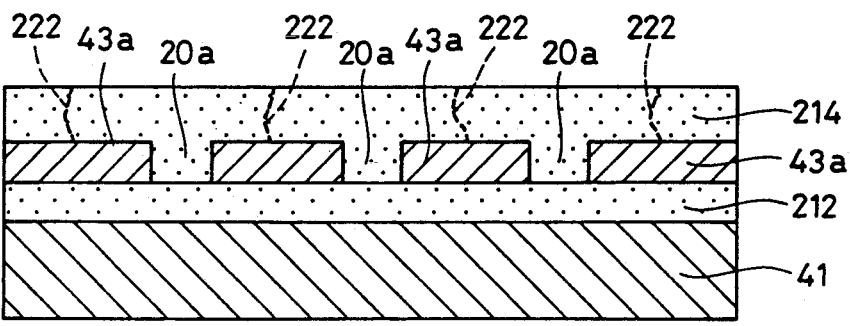

Furthermore, in the process shown in FIG. 4D, the composite including the substrate 41 having undergone the above-mentioned processes is housed within a vacuum chamber, held at the temperature of 600° C. and thermally treated. As a result, the n+-type amorphous silicon layer 42 and the i-type amorphous semiconductor layer 44 are crystallized to form an n+-type polycrystalline silicon layer 212 and an n−-type polycrystalline silicon layer 214. This process of crystallization is called "solid phase growth". When growing, the n+-type amorphous silicon layer 42 crystallizes earlier than the i-type amorphous silicon layer 44, the n+-type amorphous silicon layer 42 located in the strait regions 20a becomes a core for crystallization of the i-type amorphous silicon layer 44, and the crystallization proceeds from the portions of the strait regions 20a. Therefore, grain boundary portions 222 concentrate in the intermediate portions of the adjacent strait regions 20a, 20a.

Figure 4E:
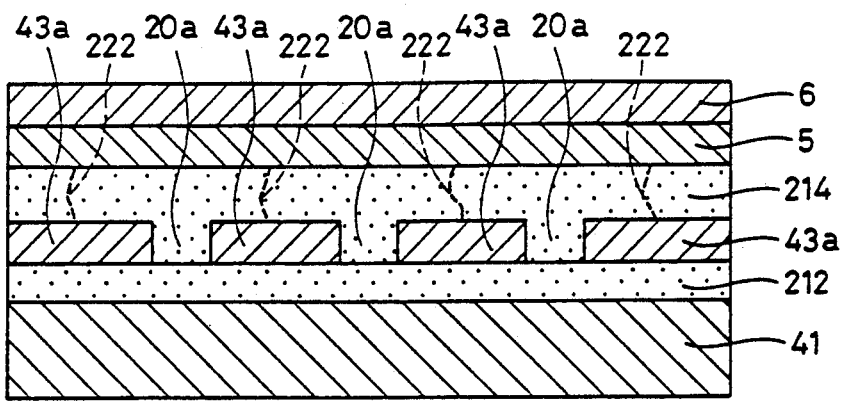
Figure 4F:
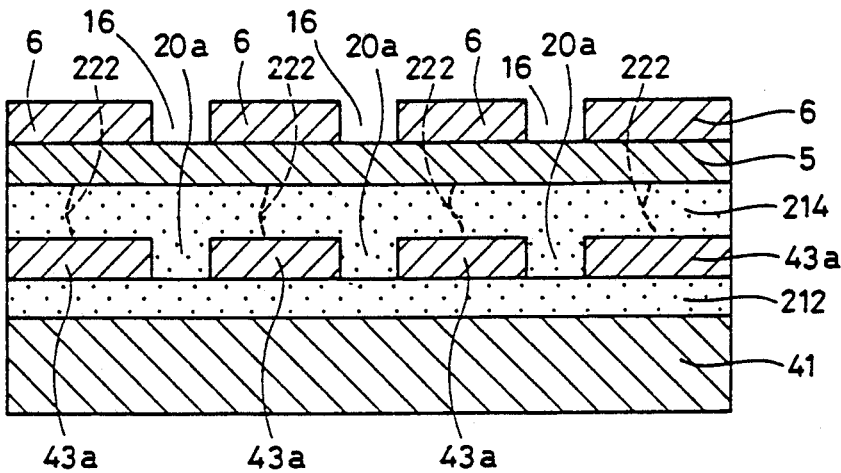
Figure 4G:
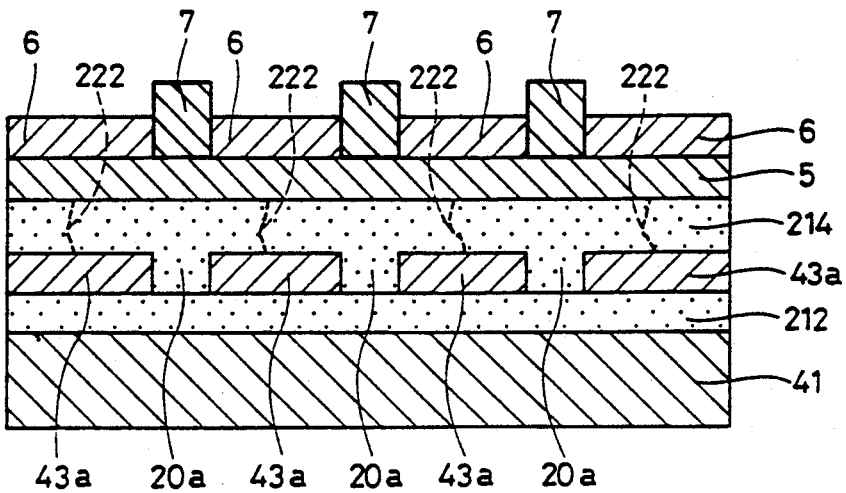

After that, in accordance with the processes shown in FIGS. 4E to G, a photovoltaic device is formed. As the processes of FIGS. 4E to G are the same as those shown in FIGS. 1E to G stated above, respectively, the description thereof will not be repeated here.

In the photovoltaic device manufactured in this way, when light is entered from the side of the surface electrodes 7, photocarriers are generated and the generated photocarriers are collected to the sides of the substrate 41 to be a back electrode and the surface electrodes 7, respectively. At this time, as stated before, the surface electrodes 7 are in contact with the p+-type amorphous silicon layer 5 above the strait regions 20a and the grain boundaries 222 are located in the intermediate portions of the strait regions 20a, 20a, so that the probability that the photocarriers cross the grain boundaries 222 becomes very low, recombination of the photocarriers in the portions of the grain boundaries 222 is controlled by a large margin and the photoelectric converting efficiency is enhanced.

A fourth embodiment of the present invention will now be described with reference to FIGS. 6A to G.

Figure 6A:
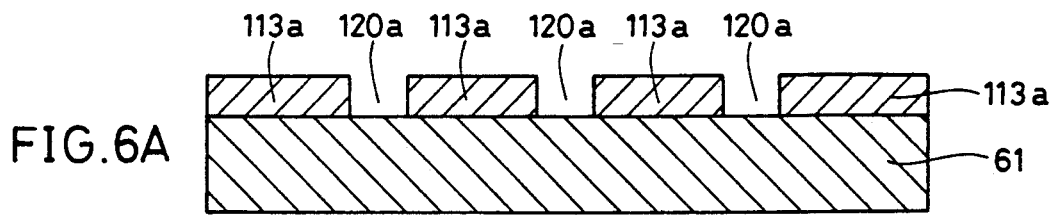
FIGS. 6A to G are sectional views showing a manufacturing method of a photovoltaic device according to a fourth embodiment of the present invention in order of process.

Firstly, as shown in FIG. 6A, an insulating film having a thickness of 10-100 Å such as silicon oxide is formed on a substrate 61 having a conductive surface. For example, the insulating film including silicon oxide is formed by sputtering. As reactive gases, argon (Ar) with a flow rate of 16 sccm and O$_2$ with a flow rate of 4 sccm are employed and other forming conditions are the RF power: 300 W and the temperature of the substrate 61: 300° C.

After that, the insulating film is patterned by photolithography to form island regions 113a of the remaining insulating film and strait regions 120a where the surface of the substrate 61 is partially exposed, wherein the distance between the two adjacent strait regions 120a is set to be on the order of 1-500 μm.

Figure 6B:
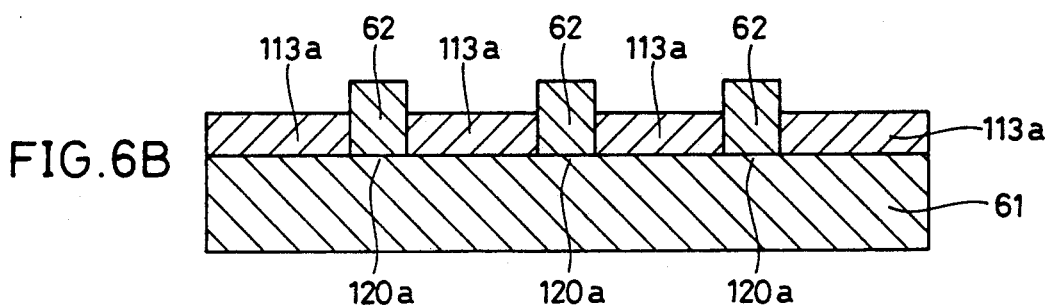

Subsequently, as shown in FIG. 6B, an n+-type amorphous silicon layer 62 having a thickness of 5000 Å doped with n-type impurities is formed on the island regions 113a and the strait regions 120a formed over the substrate 61. For example, the n+-type amorphous silicon layer 62 is formed using the radio frequency (RF) glow discharge method. As reactive gases, SiH$_4$ with a flow rate of 10 sccm and PH$_3$ (1%)/H$_2$ with a flow rate of 10 sccm are employed and other forming conditions are the temperature of the substrate 61: 300° C., the RF power: 20 W and the gas pressure: 300 mTorr. Then, this amorphous silicon layer 62 is patterned to remain only in the strait regions 120a.

Figure 6C:
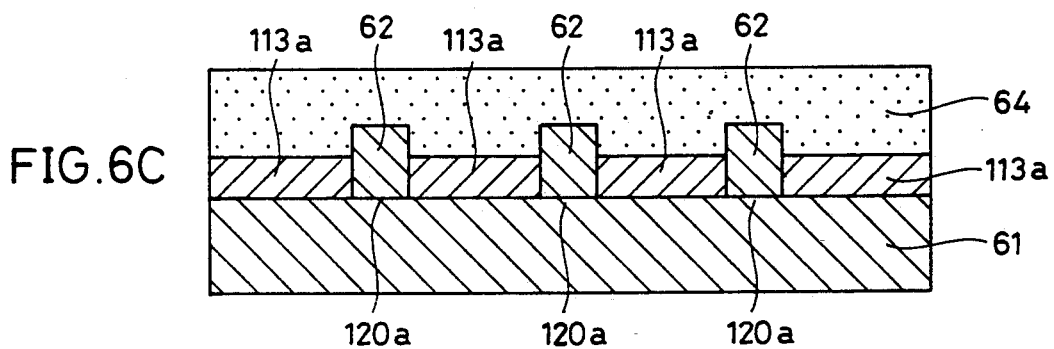

Then, as shown in FIG. 6C, an i-type amorphous silicon layer 64 having a thickness of 10 $\mu$m is formed on the n+-type amorphous silicon layer 62 and the island regions 113a formed over the substrate 61. This i-type amorphous silicon layer 64 is formed by the RF glow discharge method in the same way as stated above.

Figure 6D:
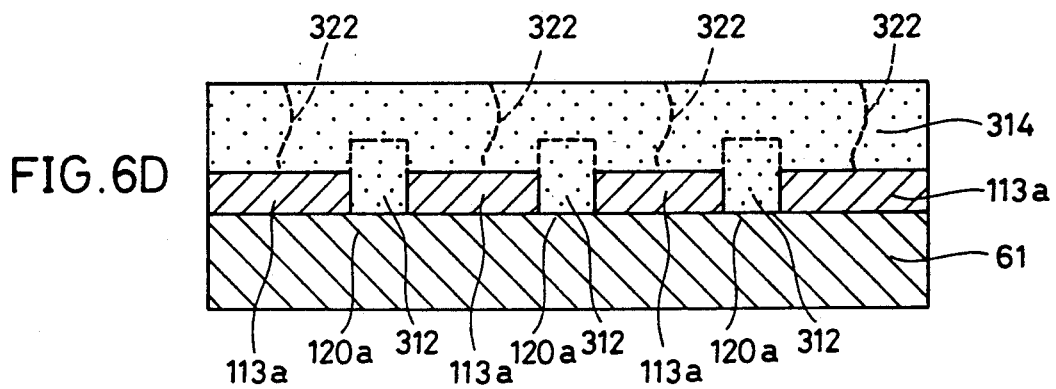

Furthermore, in the process shown in FIG. 6D, the composite including the substrate 61 is housed in a vacuum chamber, held at the temperature of 600° C. and thermally treated. As a result, the n+-type amorphous silicon layer 62 and the i-type amorphous semiconductor layer 64 are crystallized to form an n+-type polycrystalline silicon layer 312 and an n$^-$-type polycrystalline silicon layer 314. When growing, the n+-type amorphous silicon layer 62 crystallizes earlier than the i-type amorphous silicon layer 64, the n+-type amorphous silicon layer 62 formed in the strait regions 120a becomes a core for crystallization of the i-type amorphous silicon layer 64, and the crystallization proceeds from the portions of the strait regions 120a. Therefore, grain boundary portions 322 concentrate in the intermediate portions of the adjacent strait regions 120a, 120a.

Figure 6E:
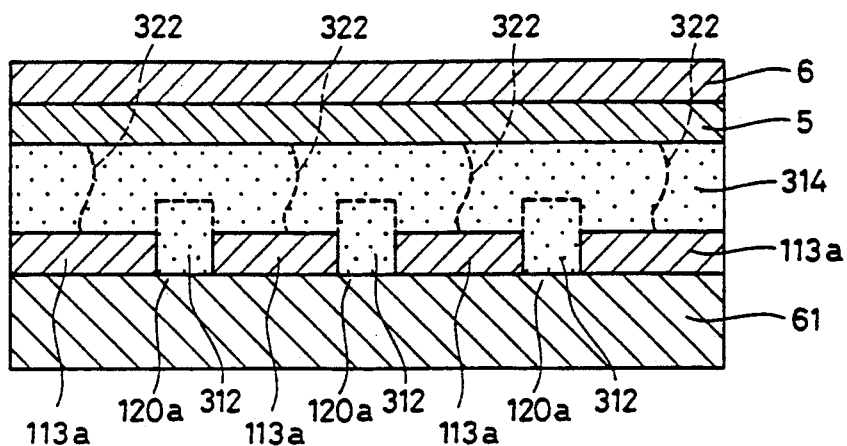
Figure 6F:
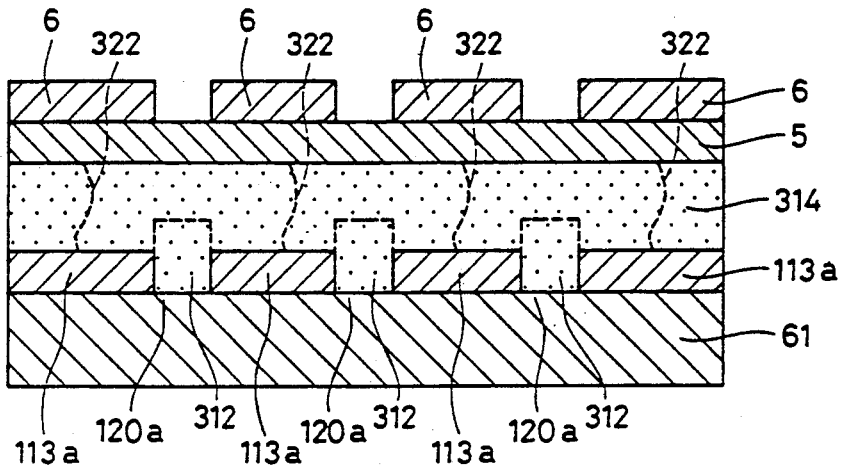
Figure 6G:
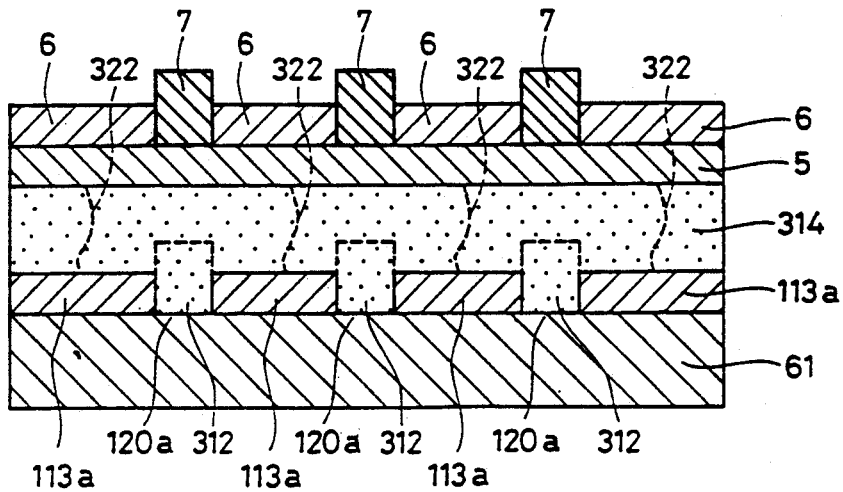

After that, in accordance with the processes shown in FIGS. 6E to G, a photovoltaic device is formed. As the processes of FIGS. 6E to G are the same as those shown in FIGS. 1E to G stated above, respectively, the description thereof will not be repeated here.

While the n+-type amorphous silicon layer is employed as an amorphous semiconductor layer doped with impurities which determine the conductivity type in each of the above-described embodiments, a p+-type amorphous silicon layer may be used.

When a transparent material is used as the substrate, the light is entered from the side of the substrate and, at this time, the surface electrodes function as back electrodes.

A fifth embodiment of the present invention will now be described with reference to FIGS. 7A to E.

Figure 7A:
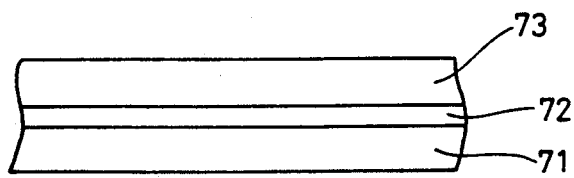
FIGS. 7A to E are sectional views showing a manufacturing method of a photovoltaic device according to a fifth embodiment of the present invention in order of process.

Firstly, as shown in FIG. 7A, a p+-type polycrystalline silicon layer 72 having a thickness of 500–2000 Å is formed on a substrate 71 having a conductive surface. For example, the p+ type polycrystalline silicon layer 72 is obtained by forming a p+-type amorphous silicon layer and then thermally treating the same at the temperature of 600°–800° C. For example, the p+-type amorphous silicon layer is formed using the radio frequency (RF) glow discharge method. As a reactive gas, a gas obtained by mixing SiH$_4$ and B$_2$H$_6$ in the proportion 100: 3–10 is employed, and other forming conditions are the temperature of the substrate 71: 200°–300° C., the RF power: 10–50 W and the gas pressure: 100–500 mTorr.

Furthermore, an i-type amorphous silicon layer 73 having a thickness of 2–20 $\mu$m is formed on the p+-type polycrystalline silicon layer 72. This i-type amorphous silicon layer 73 is formed using the radio frequency (RF) glow discharge method. As a reactive gas, SiH$_4$ is employed and other forming conditions are the temperature of the substrate 71: 200°–300° C., the RF power: 10–50 W, and the gas pressure: 100–500 mTorr.

Figure 7B:
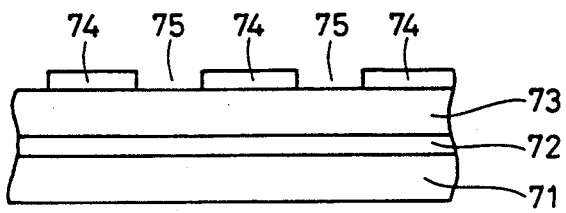

Subsequently, as shown in FIG. 7B, an insulating film 74 having a thickness of 10–100 Å such as silicon nitride is formed on the i-type amorphous silicon layer 73. For example, the insulating film including silicon nitride is formed by the RF glow discharge method. As a reactive gas, a gas obtained by mixing SiH$_4$ and NH$_3$ in the proportion 100 : 1–2 is employed and other forming conditions are the temperature of the substrate 71: 200°–300° C., the RF power: 10–50 W and the gas pressure: 100–500 mTorr.

After that, the insulating film 74 is patterned by photolithography to form aperture regions 75 of almost circular shape where the surface of the i-type amorphous silicon layer 73 is partially exposed.

Figure 7C:
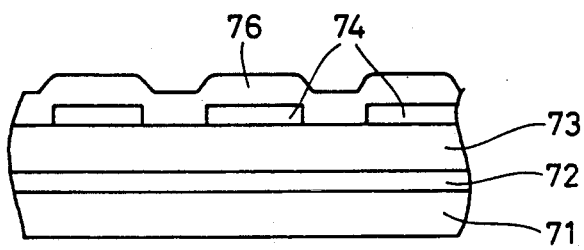

Then, as shown in FIG. 7C, an n+-type amorphous silicon layer 76 having a thickness of 500–2000 Å doped with n-type impurities with a high concentration is formed on the insulating film 74 and the aperture regions 75 formed over the substrate 71. For example, the n+-type amorphous silicon layer 76 is formed using the radio frequency (RF) glow discharge method. As a reactive gas, a gas obtained by mixing SiH$_4$ and PH$_3$ in the proportion 100:3–10 is employed and other forming conditions are the temperature of the substrate 71: 200°–300° C., the RF power: 10–50 W and the gas pressure: 100–500 mTorr.

Figure 7D:
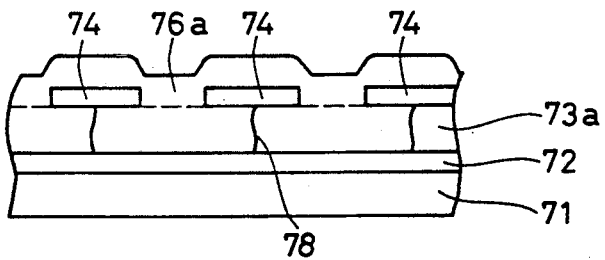

Furthermore, in the process shown in FIG. 7D, the composite including the substrate 71 is housed within a vacuum chamber, held at the temperature of 500°–600° C. and thermally treated. As a result, the n+-type amorphous silicon layer 76 and the i-type amorphous semiconductor layer 73 are crystallized to form an n+-type polycrystalline silicon layer 76a and an n+-type polycrystalline silicon layer 73a. When growing, the n$^-$-type amorphous silicon layer 76 crystallizes earlier than the i-type amorphous silicon layer 73, the n+-type amorphous silicon layer 76 formed in the aperture regions 75 becomes a core for crystallization of the i-type amorphous silicon layer 73, and the crystallization proceeds radially from the portions of the aperture regions 75. Therefore, grain boundary portions 78 concentrate in the intermediate portions of the adjacent aperture regions 75, 75.

The crystallization of the i-type amorphous silicon layer 73 proceeds from the side of the p+-type polycrystalline silicon layer 72 as well as from the side of the n+-type polycrystalline silicon layer 76a.

However, since the p+-type polycrystalline silicon layer 72 has no patterning such as the aperture regions 75 in the insulating film 74, the crystallization of the i-type amorphous silicon layer 73, which proceeds from the surface of the p+-type polycrystalline silicon layer 72, is caused vertically to the surface of the p+-type polycrystalline silicon layer 72 and from the entire portion of the surface. As a result, the growth rate of the crystallization is lower than the rate of crystallization from the side of the n+-type polycrystalline silicon layer 76a. Therefore, the crystallization of the i-type amorphous silicon layer 73 proceeds, while greatly influenced from the side of the n+-type polycrystalline silicon layer 76a.

Figure 7E:
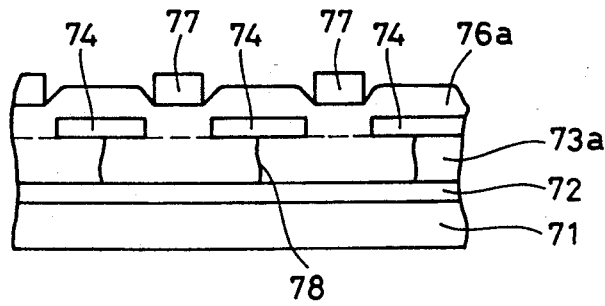

Finally, as shown in FIG. 7E, comb-shaped surface electrodes 77 are formed on the n+-type polycrystalline silicon layer 76a above the aperture regions 75. The surface electrodes 77 are obtained by forming a single layer film including a metal such as silver, titanium, aluminum, copper or the like or a multilayer film of these metals on the surface of the n+-type polycrystalline silicon layer 76a by evaporation or sputtering and then patterning the same.

In the photovoltaic device manufactured in this way, when light is entered from the side of the surface electrodes 77, photocarriers are generated and the generated photocarriers are collected to the sides of the substrate 71 to be a back electrode and the surface electrodes 77. At this time, the surface electrodes 77 are in contact with the n+-type amorphous silicon layer 76a above the aperture regions 75 and the grain boundaries are located in the intermediate portions of the aperture regions 75, 75, so that the probability that the photocarriers cross the grain boundaries becomes very low, recombination of the photocarriers in the portions of the grain boundaries is controlled by a large margin and the photoelectric converting efficiency is enhanced.

In this embodiment, when the aperture regions 75 are formed with the distance therebetween being in a range of 1-500 μm, the converting efficiency of 12-14% has been obtained and when the distance is 10-200 μm, the converting efficiency of 13-14% has been obtained. From this result, it is assumed that if the distance between the aperture regions 75 arranged is too short, the grain size of the n+-type polycrystalline silicon layer 73a cannot grow large while if said distance is too long, the tip of the crystal of the n+-type polycrystalline silicon layer 73a does not reach about the middle of the adjacent aperture region, and the crystallization stops halfway.

According to an experiment, the optimum distance between the aperture regions 75 was 50-150 μm and the value of 13.5%-14% was obtained as the converting efficiency.

While the aperture regions 75 are formed by patterning the insulating film 74 in this fifth embodiment, the present invention is not limited to this and, the portion of the strait region between the islands may be removed by leaving the insulating film as islands.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a photovoltaic device, comprising the steps of:
   forming an amorphous semiconductor layer of one conductivity type doped with impurities determining the conductivity type on a substrate having a conductive surface;
   forming an insulating film on said amorphous semiconductor layer;
   patterning said insulating film and partially forming aperture regions where the surface of said amorphous semiconductor layer is exposed;
   forming an intrinsic amorphous semiconductor layer on said insulating film and the aperture regions formed over the substrate;
   applying thermal treatment to said amorphous semiconductor layer of one conductivity type and the intrinsic amorphous semiconductor layer, advancing crystallization using the amorphous semiconductor layer of one conductivity type located beneath said aperture regions as a core, and forming a polycrystalline semiconductor layer of one conductivity type;
   forming a semiconductor layer of opposite conductivity type on this polycrystalline semiconductor layer; and
   forming an electrode which comes in contact with the semiconductor layer region of opposite conductivity type located over said aperture regions.

2. The method of manufacturing the photovoltaic device according to claim 1, wherein said aperture regions include holes formed in said insulating film.

3. The method of manufacturing the photovoltaic device according to claim 1, wherein said aperture regions include strait regions surrounding said insulating film arranged in an island manner.

4. The method of manufacturing the photovoltaic device according to claim 1, wherein the distance between said aperture regions arranged is 1-500 μm.

5. A method of manufacturing a photovoltaic device, comprising the steps of:
   forming an insulating film on a substrate having a conductive surface;
   patterning this insulating film and partially forming aperture regions where the surface of said substrate is exposed;
   forming an amorphous semiconductor layer of one conductivity type doped with impurities determining the conductivity type only in the aperture regions;
   forming an intrinsic amorphous semiconductor layer on said insulating film and the amorphous semiconductor layer of one conductivity type formed over said substrate;
   thermally treating said amorphous semiconductor layer of one conductivity type and the intrinsic amorphous semiconductor layer, advancing crystallization using said amorphous semiconductor layer of one conductivity type as a core and forming a polycrystalline semiconductor layer of one conductivity type;
   forming a semiconductor layer of opposite conductivity type on this polycrystalline semiconductor layer; and
   forming an electrode which comes in contact with the semiconductor layer region of opposite conductivity type located over said aperture regions.

6. The method of manufacturing the photovoltaic device according to claim 5, wherein said aperture regions include holes formed in said insulating film.

7. The method of manufacturing the photovoltaic device according to claim 5, wherein said aperture regions include strait regions surrounding said insulating film arranged in an island manner.

8. The method of manufacturing the photovoltaic device according to claim 5, wherein the distance between said aperture regions arranged is 1-500 μm.

9. A method of manufacturing a photovoltaic device, comprising the steps of:
   forming a semiconductor layer of one conductivity type and an intrinsic amorphous semiconductor layer layered in this order on a substrate having a conductive surface;
   forming an insulating film on said amorphous semiconductor layer;

patterning said insulating film and partially forming aperture regions where the surface of said intrinsic amorphous semiconductor layer is exposed;

forming an amorphous semiconductor layer of opposite conductivity type on said insulating film and the aperture regions formed over the substrate;

thermally treating said intrinsic amorphous semiconductor layer and the amorphous semiconductor layer of opposite conductivity type, advancing crystallization using the amorphous semiconductor layer of opposite conductivity type located in said aperture regions as a core, and forming a polycrystalline semiconductor layer of opposite conductivity type; and forming an electrode which comes in contact with said polycrystalline semiconductor layer region of opposite conductivity type located over said aperture regions.

10. The method of manufacturing the photovoltaic device according to claim 9, wherein said aperture regions include holes formed in said insulating film.

11. The method of manufacturing the photovoltaic device according to claim 9, wherein said aperture regions include strait regions surrounding said insulating film arranged in an island manner.

12. The method of manufacturing the photovoltaic device according to claim 9, wherein the distance between said aperture regions arranged is 1–500 μm.

13. The method of manufacturing the photovoltaic device according to claim 9, wherein said semiconductor layer of one conductivity type includes a polycrystalline semiconductor layer.

* * * * *